United States Patent [19]

McMurray

[11] Patent Number: 4,723,188
[45] Date of Patent: Feb. 2, 1988

[54] PERMANENT MAGNET SURGE ARRESTOR FOR DC POWER CONVERTER

[75] Inventor: William McMurray, Schenectady, N.Y.

[73] Assignee: General Electric Company, Schenectady, N.Y.

[21] Appl. No.: 907,352

[22] Filed: Sep. 15, 1986

[51] Int. Cl.⁴ ............................................ H02H 7/122
[52] U.S. Cl. ...................................... 361/18; 361/93; 361/133; 363/137; 363/139
[58] Field of Search .................. 361/18, 19, 57, 58, 361/93, 133; 363/135, 136, 137, 139, 178

[56] References Cited

U.S. PATENT DOCUMENTS

| | | | |
|---|---|---|---|
| 3,331,011 | 7/1967 | Landis | 363/137 X |
| 4,257,080 | 3/1981 | Bartram et al. | 361/19 |
| 4,331,994 | 5/1982 | Wirth | 361/56 |

Primary Examiner—A. D. Pellinen
Assistant Examiner—Derick S. Jennings
Attorney, Agent, or Firm—Marvin Snyder; James C. Davis, Jr.

[57] ABSTRACT

An improved surge current limiting method and apparatus is provided for an inverter circuit. The inverter includes electronic switching devices serially connected between relatively positive and negative voltage buses and alternately conductive for providing alternating current paths through a load connected to a terminal intermediate the two switching devices. An inductor connected in series with the switching devices is provided with a permanent magnet core which is magnetically polarized in a direction such that current through the inductor attempts to reverse the magnetic polarity of the permanent magnet. The inductor is sized such that normal current through the inductor is not appreciably attenuated by the inductance. Under fault current conditions, the magnetic field generated by the higher currents through the inductor is opposed by the magnetic field of the permanent magnet so as to provide a substantial current limiting effect. The permanent magnet current limiting inductor may be used in various locations in an inverter circuit and may be applied to either single phase or multi-phase inverters.

15 Claims, 13 Drawing Figures

Fig. 5A (DEENERGIZED)  Fig. 5B (ENERGIZED)

PERMANENT MAGNET SURGE ARRESTOR FOR DC POWER CONVERTER

The present invention relates to electronic power converter circuits and, more particularly, to surge current limiting arrangements for converter circuits.

BACKGROUND OF THE INVENTION

Direct current (DC) to alternating current (AC) power converters are known which use two switching devices connected in series in each leg of a plural leg converter, the junction of each series connected pair of switching devices comprising an output of the converter. Such converters are widely used in adjustable speed AC motor drives where a pulse-width modulated three-phase bridge inverter supplies a voltage of adjustable amplitude and frequency to a motor. When such circuits are operated, care must be taken to assure that only one of the switching devices in each leg of the inverter is conductive at any given time. If both switching devices become simultaneously conductive, a direct short circuit exists across the power lines connected to the switching devices. Many different circuits have been devised for protecting switching devices from destruction by fault current upon such simultaneous conduction. Typically, such protection circuits utilize a choke or inductor serially connected between the inverter and the source of inverter current to limit the rate of rise of fault current. An example of such prior art circuits is shown in W. F. Wirth U.S. Pat. No. 4,331,994 in which an inductor is connected in series with a filter capacitor to limit fault current rise time. In addition, a precharged capacitor, included in a crowbar circuit connected across the DC bus, discharges through the faulted switching devices in a direction opposite to the fault current in order to effect a fast turn-off of the devices.

The amount of current that can be interrupted by power semiconductor switching devices is limited, sometimes by the devices themselves and at other times by auxiliary equipment associated with the devices. In the case of transistors and gate turn-off thyristors, the current limit is set by internal power dissipation. In the case of conventional thyristors, such as silicon controlled rectifiers (SCRs), the limit is set by the size of the auxiliary commutating circuit. Regardless of the type of switching devices used, the available energy which must be discharged through the devices upon a fault condition is generally capable of destroying the devices. This energy discharge mainly arises from DC filter capacitors connected across the power lines to which the switching devices are connected. The DC filter capacitors are provided to limit the DC voltage ripple and at the same time supply the ripple current. If non-electrolytic capacitors are used, the capacitance of the filter capacitors is determined by the allowable voltage excursions. For such conditions, the current rating is more than adequate and the energy stored is minimized so that its discharge during the fault may not present a significant problem. Because the capacitors of a non-electrolytic filter bank are large and expensive, however, electrolytic capacitors are generally used instead if the DC voltage is relatively low, for example, less than 1000 volts. The electrolytic filter capacitor size is determined by the current rating of the component capacitors, which rating is relatively small, and results in much greater capacitance than is needed to limit the voltage ripple. Accordingly, a large amount of energy is stored in a high capacitance and its discharge during faults poses a problem.

Figure 1:
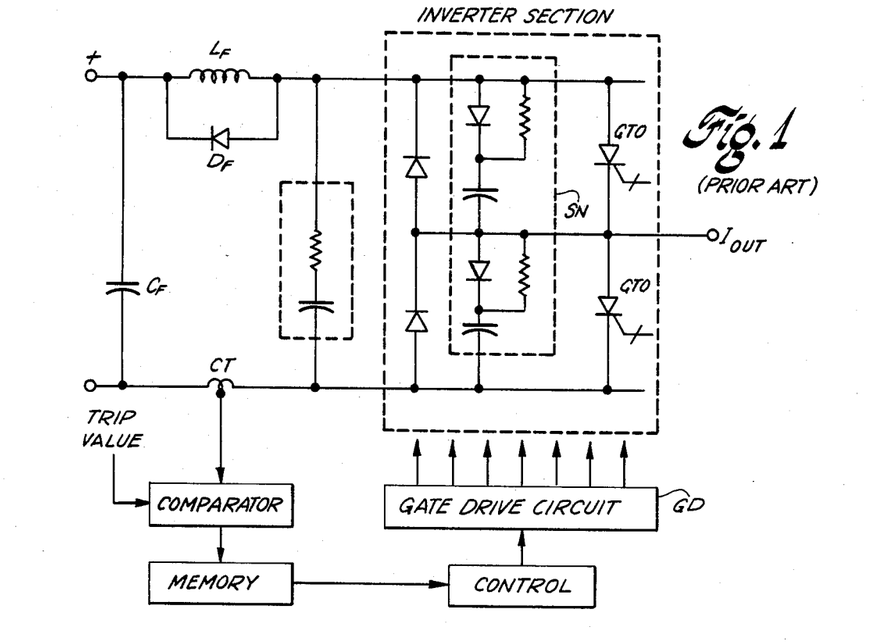
FIG. 1 is a schematic diagram illustrating a prior art voltage source converter with current limiting.

An example of one phase of a prior art inverter is shown in FIG. 1. This inverter utilizes a pair of gate turn-off thyristors (GTOs) for switching the direction of current at the output terminal labeled $I_{out}$. In order to protect the GTOs from fault currents, a current limiting reactor $L_F$ is inserted into the DC input section of the inverter. Since it is desirable to maintain the reactance or inductance value of the reactor $L_F$ as low as possible, there is also provided a current sensor CT which senses fault currents and applies a signal to a comparator for comparison against a maximum allowable current or trip value. If the fault current exceeds the trip value, a signal from the comparator is applied to a memory circuit which then applies signals to a control circuit to control the gating signals applied by a gate circuit to the controllable switching devices in the inverter. The majority of the fault current is provided by the filter capacitor bank $C_F$ which discharges through the series reactor $L_F$ and the GTOs. A gate driver circuit GD and a snubber circuit SN are also included for controlling operation of the GTOs under normal conditions. The snubber circuit limits the rate of change of voltage during switching of the GTOs.

A disadvantage of the prior art circuit such as that shown in FIG. 1 is that the inductor $L_F$ must be large enough to limit fault current rise time and yet must absorb only a minimum amount of energy during normal operation of the circuit. Ideally, the value of inductor $L_F$ should be small enough that no significant heating effects are observable during normal operation. However, such a design is seldom practical if the value of the reactance of induction $L_F$ is to be sufficiently large to limit fault current through the GTOs.

SUMMARY OF THE INVENTION

An object of the present invention is to overcome the abovementioned disadvantages of the prior art by eliminating the need for a reactor between the filter capacitor and inverter. Furthermore, the present invention desirably achieves the above result without adding significant bulk or losses to the inverter circuit. In the present invention, a snubber inductor in a DC voltage fed inverter is wound on a core of premagnetized permanent magnetic material. The reactance of the snubber inductance is such that it has very little effect on normal operation. In an illustrative embodiment, the inductor is positioned in the circuit in series connection between a pair of switching devices in one leg of a bridge type inverter. During a fault condition, when the DC source is essentially short-circuited across the inductor, the current is limited by the coercive field strength of the magnetic core. Much of the energy discharged from a DC filter capacitor connected to the inverter is absorbed by the magnetic material in reversing its polarity. Apparatus is also operatively associated with the inductor for sensing the polarity of the magnetic field generated by the permanent magnetic material and for inhibiting operation of the inverter until the magnetic material has been reset or until the electrical connections to the inductor are reversed so that a subsequent fault current will also be impeded by the polarity of the permanent magnet.

DETAILED DESCRIPTION OF THE DRAWINGS

For a better understanding of the present invention, reference may be had to the following detailed description taken in conjunction with the accompanying drawings in which.

DETAILED DESCRIPTION OF THE INVENTION

Figure 2:
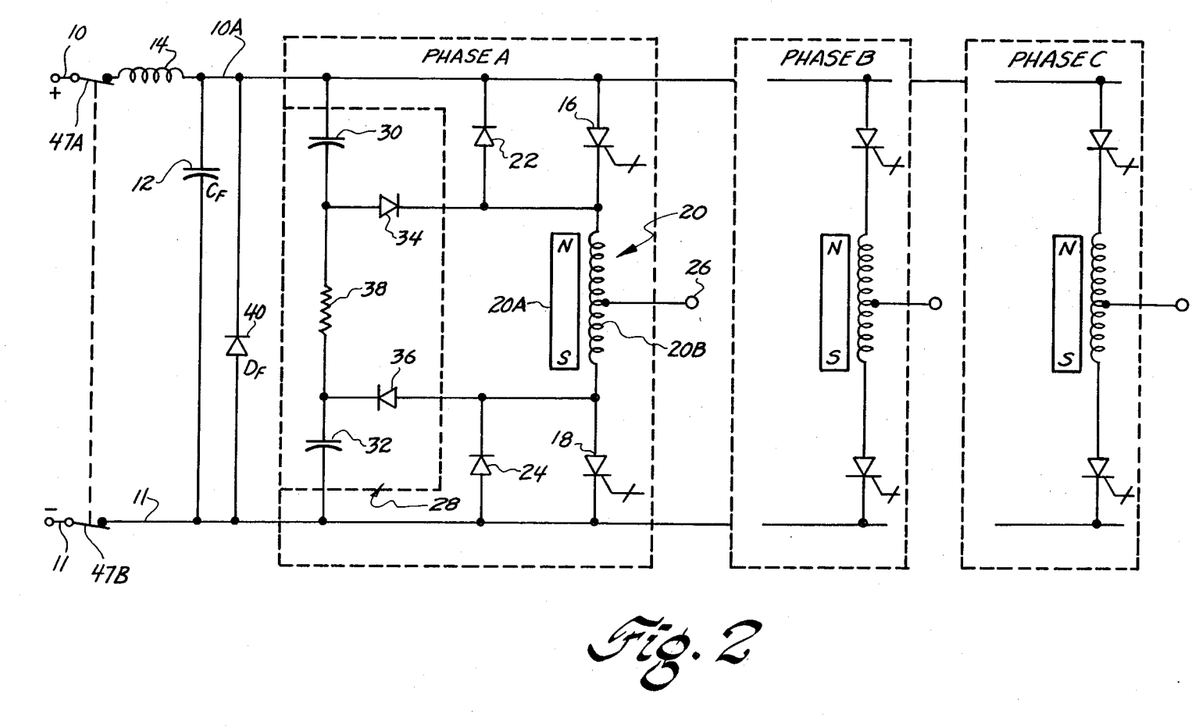
FIG. 2 is a schematic diagram of an inverter circuit with applicant's improved fault protection arrangement.

One phase of a GTO thyristor inverter incorporating a permanent magnet fault current limiting reactor in accordance with the present invention is shown in FIG. 2. A pair of relative positive and negative DC voltage buses 10 and 11, respectively, are connected to a filter capacitor 12 through a serially connected inductor 14. A pair of switching devices 16 and 18 are coupled in series across filter capacitor 12. As is known, the primary current source for switching devices 16 and 18 is the filter capacitor 12 rather than the voltage source connected to DC lines 10 and 11. Current from the voltage source coupled through inductor 14 charges capacitor 12 so that energy is always available for switching. Inductor 14 serves to isolate the voltage source from the transient voltage fluctuations on bus extension 10A caused by switching of devices 16 and 18. The inventive permanent magnet fault current limiting inductor or reactor 20 is serially connected between switching devices 16 and 18. Reactor 20 comprises a coil 20B wound on a permanent magnet core 20A.

Before discussing the inventive fault current limiting aspects of the present invention, the other elements of the inverter circuit will be first described. It should be noted that FIG. 2 illustrates only one leg or phase of a multiphase inverter. A three-phase inverter of the type shown in FIG. 2 is illustrated and described in detail in U.S. Pat. No. 4,390,826 to Erdman et al. issued June 28, 1983 and assigned to General Electric Company. Referring again to FIG. 2, a feedback diode 22 is coupled in anti-parallel circuit arrangement with switching device 16 and a feedback diode 24 is coupled in anti-parallel circuit arrangement with switching device 18. The output of this single leg of the inverter is taken at terminal 26. The reactor or inductor 20 is center tapped or divided into two sections, each section acting as a series inductive snubber to limit current rise time during turn on of a respective one of switching devices 16 and 18. A snubber circuit 28 limits the rate of change of voltage (DV/DT) during turn off of switching devices 16 and 18. The snubber circuit includes first and second capacitors 30 and 32 which act as shunt capacitor snubbers and first and second diodes 34 and 36 which control charging and discharging of the snubber capacitors. A resistor 38 interconnects snubber capacitors 30 and 32 and completes the charge and discharge current paths. A diode 40 designated $D_F$ provides a reverse current circulation path during reversal of voltage across inductive reactor 20 during fault conditions. A more detailed description of snubber circuits is given in McMurray U.S. patent application Ser. No. 705,259 filed Feb. 25, 1985, and assigned to General Electric Company.

In the circuit of FIG. 2, the inductance of reactor or inductor 14 is much greater than the inductance of reactor 20. Reactor 20 limits the peak current discharge from filter capacitor 12 during a fault. The energy transferred to reactor 20 during the fault condition is subsequently dissipated as the current circulates through reactor 20 and diode 40 when the voltage across reactor 20 reverses. The larger inductance of inductor 14 limits the current after capacitor 12 has discharged until the voltage source connected to buses 10 and 11 is removed by some type of circuit interruption device such as, for example, a fuse or a circuit breaker 47A and 47B. Any fault current propagating through reactor 20 will attempt to generate a magnetic field having a polarity opposite to the polarity of the magnetic field generated by magnetic core 20A of reactor 20. For normal operation, the incremental permeability of saturated core 20A is close to unity so that the inductance of reactor 20 will be nearly the same as for an air core reactor. Normal current through reactor 20 will produce a maximum magnetic field which is only about 10% of the coercive force of core 20A. Since the resistivity of the core material of core 20A is selected to be extremely high, the eddy current losses caused by variations in normal current through inductive winding 20B will be negligible. In comparison, a conventional inductor such as inductor $L_F$ in FIG. 1 will cause considerable extra losses since the peak DC line current is maintained in inductor $L_F$ by circulation through diode $D_F$.

Figure 3:
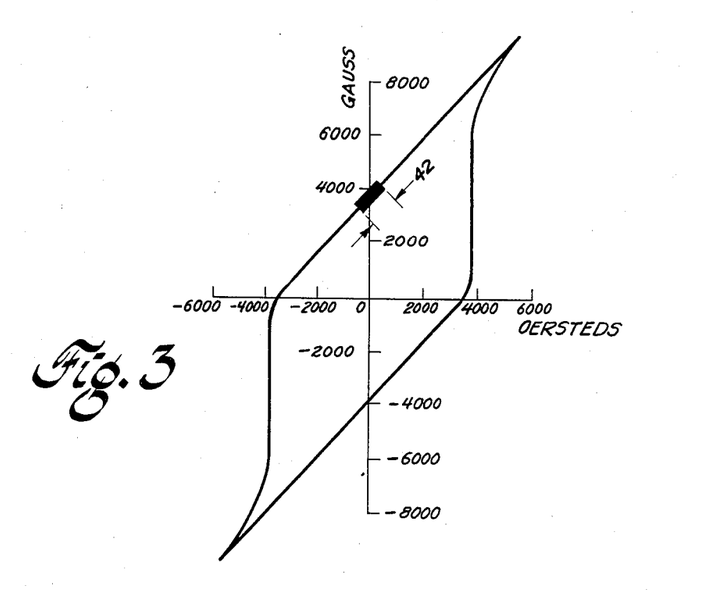
FIG. 3 is a hysteresis loop diagram of a permanent magnet material illustrating operation under normal condition of applicant's improved fault current protection circuit.

FIG. 3 is a graph of a typical hysteresis loop for a ferrite magnetic material of the type contemplated for use as core 20A of FIG. 2. The normal operating range on the hysteresis loop for core 20A is indicated at 42. It will be appreciated that permanent magnet core 20A is premagnetized in polarity such that surge current into the dot end of winding 20 will reverse the magnetization of core 20A.

Figure 4A:
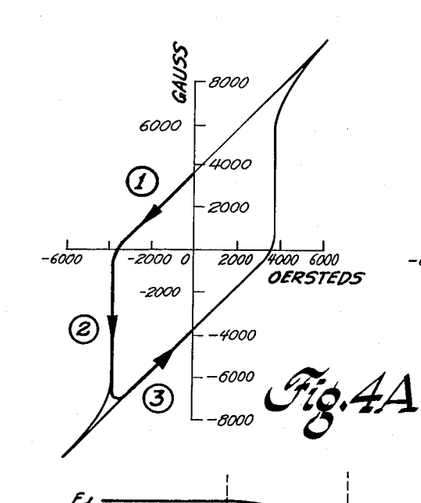
FIGS. 4A–4D graphically illustrate operation of applicant's inventive circuit under fault current conditions.

The behavior of the novel surge absorber during a fault is depicted in FIGS. 4A–4D. The heavy lines on the hysteresis loop in FIG. 4A show the magnetic path traversed during time intervals 1, 2 and 3 indicated on the transient waveforms in FIG. 4D. When the fault starts at the beginning of interval 1, the leg fault current or short-circuit current through both GTO 16 and GTO 18 simultaneously begins, and increases from the initial value $I_o$ (within the normal operating range) according to the approximate equation $$i = I_o + E_d \sqrt{\frac{C_F}{pL_s}} \sin t \sqrt{\frac{p}{C_F L_s}} \qquad (1)$$

where losses are neglected, p is the number of phases involved in the fault, $E_d$ is the source voltage, $C_F$ is the capacitance of capacitor 12, $L_s$ is the inductance of reactor 20, and t is time from start of a fault.

Interval 1 ends when the magnetic field reaches the coercive strength $H_c$ (oersteds) and the current is limited to the value $I_c$ (amperes), which for a toroidal or long selenoidal reactor is given by $$I_c = H_c l / 0.4 \pi N \tag{2}$$

where l=length of magnetic path (cm.) and N=total number of turns in winding 20B of reactor 20. If $I_c >> I_o$, solution of (1) with (2) yields the duration $t_1$ of time interval 1

$$t_1 \approx \sqrt{\frac{C_F L_s}{p}} \sin^{-1} \frac{I_c}{E_d} \sqrt{\frac{p L_s}{C_F}}. \tag{3}$$

The voltage $E_c$ on capacitor 12 at this time is $$E_c \approx \sqrt{E_d^2 - \frac{p L_s}{C_F} I_c^2}. \tag{4}$$

During interval 2, current $I_c$ discharges capacitor 12 linearly, reducing the voltage from $E_c$ to zero in time $t_2$ given by $$t_2 = E_c C_F / p I_c. \tag{5}$$

If the sides of the hysteresis loop are not vertical, the current will not quite be constant and some nonlinearity will result. With the optimum design condition shown in FIG. 4A, the intrinsic flux density (B-H) in the core will have reversed from $+B_r$ to $-B_r$ (gauss), where $B_r$ is the remanent value, essentially equal to the saturation value if the intrinsic hysteresis loop is square, as for the suggested ferrite material. The flux linkage (volt-second) equation for this optimum design is $$\tfrac{1}{2} E_c t_2 = 2 B_r A N * 10^{-8} \tag{6}$$

where A=cross-sectional area of core (cm²) and * is a multiplication symbol. Substituting (5) into (6) and using (2) for $I_c$ yields $$\frac{C_F E_c^2}{2} = \frac{p B_r H_c A l}{2\pi * 10^7} \tag{7}$$

which equates the energy in $C_F$ at the start of interval 2 to the energy absorbed by the cores, proportional to half the area of the hysteresis loop.

The energy stored in the snubber inductances during interval 1, equal to $p/2 L_s I_c^2$ is now trapped and dissiptated elsewhere in the circuit during interval 3 as the current decays. If the core properties are such that $B_r$ gauss $\approx H_c$ oersteds, as for the suggested ferrite material, then the trapped energy is proportional to the triangular area of that portion of the hysteresis loop traversed during interval 1, i.e. ¼ of the absorbed energy or 1/5 of the initial capacitor energy. The overall energy balance equation can be written $$\frac{C_F E_d^2}{2} = \frac{p B_r H_c A l}{2 * 10^7} + \frac{p}{2} L_s I_c^2. \tag{8}$$

Figure 4B:
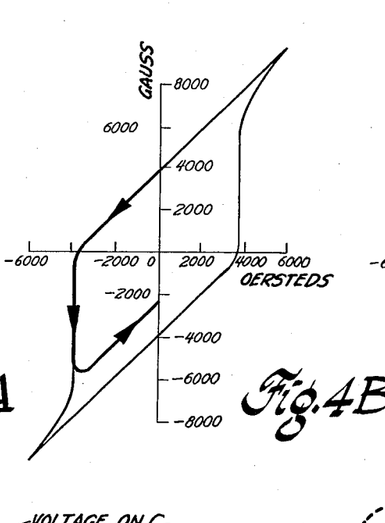
Figure 4C:
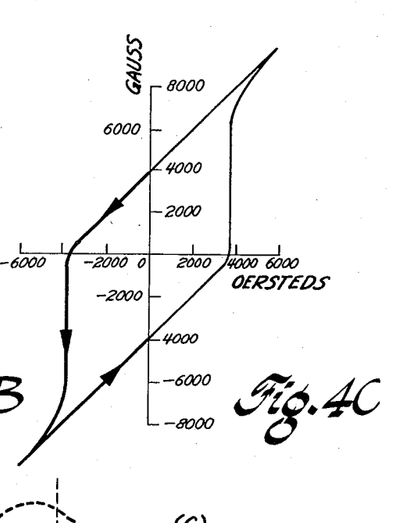
Figure 4D:
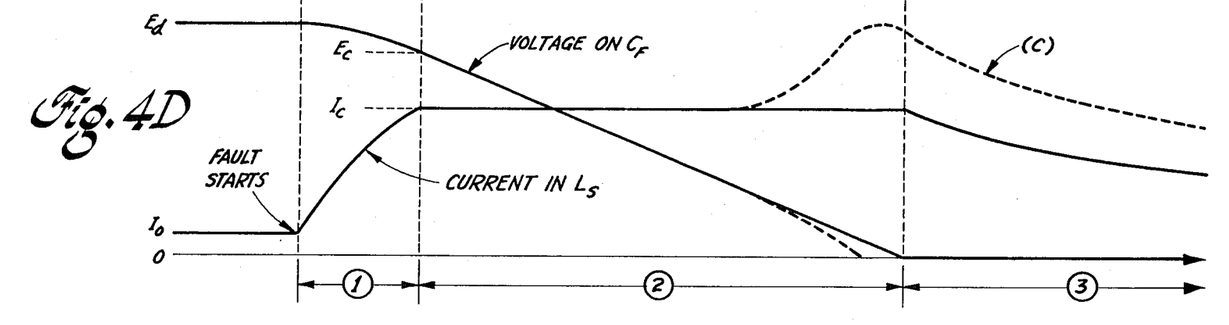

If the cores are oversized relative to the filter capacitor, the flux reversal will be incomplete, as indicated in FIG. 4B, but the surge waveforms will be similar to the optimum case. However, if the cores are undersized, the current limiting will not be perfect, as indicated in FIG. 4C and the dashed lines in the transient waveforms, resulting in more trapped energy.

Since the polarity of magnetization of core 20A is reversed by a surge, the converter will not be able to absorb another surge until the relative coil/core polarity is reversed. This is easily accomplished by interchanging the connections to the terminals of reactor 20. To ensure that the change is made, it is desirable to provide magnetic polarity detectors (such as Hall effect devices) which lock out operation of the equipment if the polarity is incorrect. For applications where fast restarting after a fault is necessary, a coil reversing switch actuated by a polarity detector can be provided as shown in FIGS. 5A and 5B.

Figure 5A:
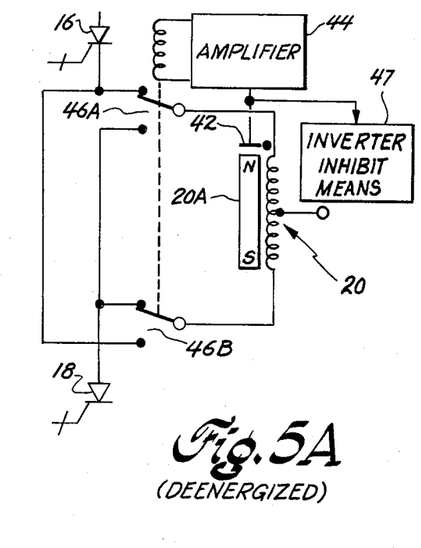
FIGS. 5A and 5B are simplified circuit illustrations of one form of magnetic polarity sensing and coil connection reversing arrangement.
Figure 5B:
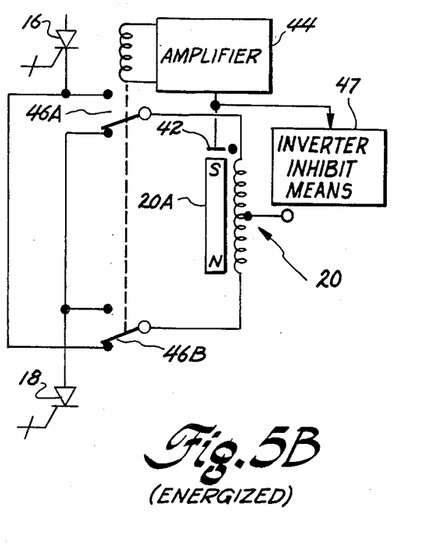

Turning briefly to FIGS. 5A and 5B, there is shown one form of coil polarity reversing arrangement. A Hall effect sensor or other type of magnetic field sensor is indicated generally at 42. Sensor 42 detects the polarity of the magnetic field produced by permanent magnet 20A. The signal from sensor 42 is coupled to an amplifier 44 which is connected for operating a solenoid switching arrangement having at least a pair of ganged switches 46A and 46B. In the unenergized mode, the switches connect reactor 20 to controllable switches 16 and 18 for passing current in a first direction. In the energized condition, current through reactor 20 is reversed by virtue of the change in connection of switches 46A and 46B. The deenergized condition is shown in FIG. 5A while the energized condition is shown in FIG. 5B.

The signal from sensor 42 may also be used to actuate inverter inhibiting means 47, thus locking out or inhibiting the inverter by opening breaker contacts 47A and 47B (FIG. 2) if the coil/core polarity is not immediately corrected by switches 46A and 46B.

The design of reactor 20 is constrained by a number of factors. For $B_r = H_c$, core 20A should be sized to absorb 80% of the filter energy:

$$\frac{p B_r H_c A l}{2\pi * 10^7} = \frac{4}{5} \frac{C_F E_d^2}{2} \tag{9}$$

which determines the necessary core volume as $$A l = \frac{4 \pi C_F E_d * 10^7}{5 p B_r H_C}. \tag{10}$$

The remaining 20% of the filter energy is trapped in the inductances:

$$\frac{p L_s I_c^2}{2} = \frac{1}{5} \frac{C_F E_d^2}{2}. \tag{11}$$

The inductance $L_s$ of resistor 20 is given by $$L_s = K\mu_i \frac{4\pi N^2 A}{l * 10^9} \quad (12)$$

where $\mu_i$=incremental permeability of the core near $H=0$, $B=\pm B_r$ ($\mu_i \approx 1$ for the proposed material), and K is a factor depending on core/coil geometry and is approximately 1 for toroidal or long solenoid construction.

A numerical example of reactor design will now be presented for a typical 3-phase bridge GTO inverter using devices such as the Toshiba SG600R21 having the following rated parameters Peak forward voltage=1300 v
Peak normal current=600 A (turn-off limit)
Peak surge current $I_c$=6000 A
Turn-on di/dt=100 A/μs The voltage rating is suitable for an inverter fed from a voltage source $E_d$=600 V. Then, the required series snubber inductance of reactor 20 is $$L_s = E_d/di/dt = 600 \text{ v}/100 \text{ A}/\mu s = 6 \mu H. \quad (13)$$

The ripple current drawn by a 3-phase inverter will be found to require an electrolytic capacitor bank having a total capacitance $C_F$=9000 μF, approximately. It will be assumed that a fault can be detected at a current slightly greater than 600 A and that all six GTO's will be turned on to share the surge between the 3-phase legs, so that p=3.

Using core material having $B_r$=4000 gauss, $H_c$=4000 oersteds, the required core volume is found from (10) to be:

$$Al = \frac{4\pi * 9000 * 10^{-6} * 600^2 * 10^7}{5 * 3 * 4000 * 4000} = 1696 \text{ cm.}^3. \quad (14)$$

For a toroidal core of depth b, inside diameter 2b and outside diameter 4b, the volume is $3\pi b^3$. The required dimension b, is then $$b = 3\sqrt{\frac{1696}{3\pi}} = 5.65 \text{ cm.} \quad (15)$$

Also, $$A = b^2 = 31.9 \text{ cm.}^2 \quad (16)$$

$l = 3\pi b = 53.2$ cm.

Rearranging (12) to calculate the required number of turns, $$N = \sqrt{\frac{6*10^{-6}*53.2*10^9}{4\pi*31.9}} = 28. \quad (17)$$

Substitution into (2) verifies the approximate current limit $$I_c = \frac{4000 * 53.2}{0.4\pi * 28} = 6048A. \quad (18)$$

Figure 6A:
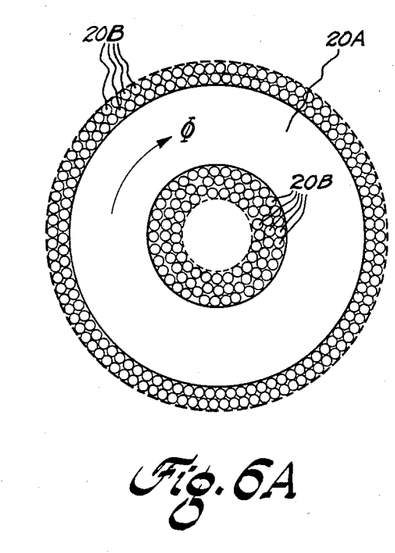
FIGS. 6A and 6B are simplified mechanical illustrations of alternate forms of permanent magnet reactors.

With dimensions rounded in inch units, this reactor has the form shown in FIG. 6A. The core can be constructed from stacked rings of ferrite material.

Figure 6B:
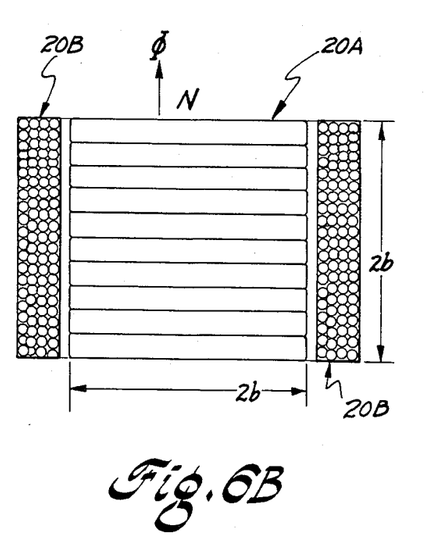

A reactor of lower-cost solenoidal construction is shown in FIG. 6B. With ferrite disks of radius b stacked to a length 2b, the volume is $2b^3$ and the required value of b is $$b = 3\sqrt{\frac{1696}{2\pi}} = 6.46 \text{ cm.} \quad (19)$$

and $2b = 12.93$ cm.$\approx 5$ in. (20)

Since the solenoid is relatively short, equations (2) and (12) are somewhat inaccurate since they assume a long solenoid. However, using N=8 turns should yield values of $I_c$ and $L_s$ that are satisfactory. This structure has the disadvantage that the open poles of the magnet would attract loose iron objects.

Figure 7:
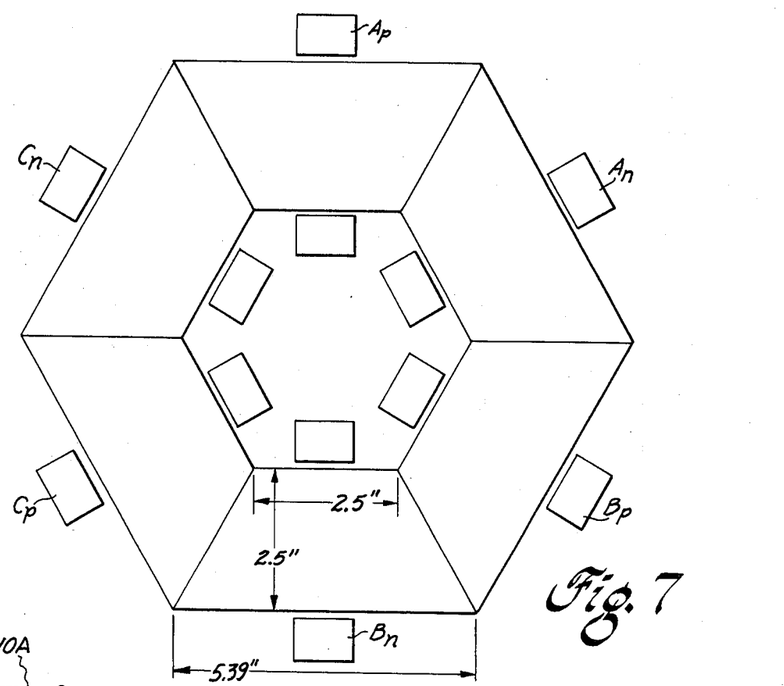
FIG. 7 is a simplified mechanical illustration of a hexagonal permanent magnet core assembly for a three-phase bridge inverter.

A hexagonal core and coil assembly for a 3-phase bridge inverter is shown in FIG. 7. Constructed from trapezoidal slabs of ferrite material, this core has the planar dimensions indicated and a core depth of 5.25 inches for a total volume of about 3*1696=5088 cm³. Six coils having an estimated 5 turns each can be wound with flat braided conductors on rectangular forms. The coils $A_p$ and $A_n$ are associated with the positive and negative DC poles, respectively, of phase leg A, and similarly for legs B and C of a three-phase inverter. With $\mu_i \approx 1$, the coupling between the coils in normal operation will be nearly the same as if the core were absent, and relatively loose. During a surge, the arrangement will behave as a toroidal reactor with the leg windings in parallel between DC buses 10A and 11.

Figure 8:
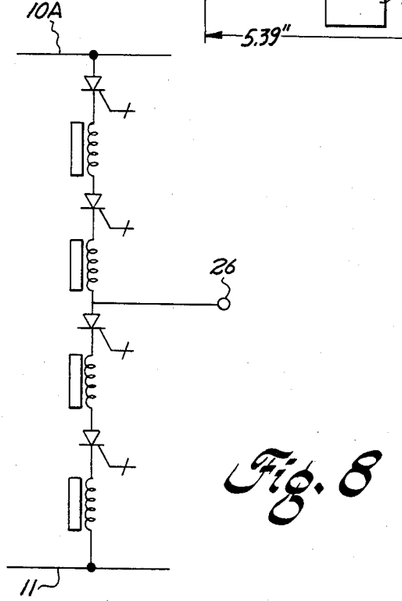
FIG. 8 shows an another alternating arrangement for the present invention.

While the implementation of the present invention has illustrated the use of a permanent magnet surge limiter connected in series between switching devices 16 and 18, it will be appreciated that a surge limiter of the type disclosed could also be placed in other locations within this circuit. For example, rather than using a center tapped inductor or reactor 20, two separate reactors would be utilized in conjunction with two separate magnetic cores. Such an application might be particularly useful for higher voltage switching circuits in which series connected switching devices were required. Such an arrangement is shown for example in FIG. 8 where a plurality of switching devices are serially connected between DC buses 10A and 11. Each of these switching devices has its own serially connected reactor on a permanent magnet core.

Another alternative arrangement for the present invention is to utilize a permanent magnet core and reactor in series with filter capacitor 12. Although a similar arrangement could be employed by placing the reactor and permanent magnet core in the DC bus 10A, the advantage of placing the magnet in series with capacitor 12 is that it avoids the average DC current flowing in rail 10A. The primary advantage of placing permanent magnet surge arrestor or reactor 20 at the location indicated in FIG. 2 is that the inductance thus provided at that location assists in turn-on and turn-off of switching devices 16 and 18. The reactance of reactor 20 at this location is typically in the range of 5 to 10 microhenrys. An inductor of this small inductance value has very little effect on the normal currents in the circuit and accordingly presents very little loss to the system. While the other alternatives of placing the reactor in series with DC filter capacitor 12 or in DC bus 10A are feasible alternatives, that arrangement still requires the addition of a reactor, whereas the reactor between the switching devices is already present.

While a preferred embodiment of the present invention has been shown and described herein, many variations, changes and substitutions will become apparent to those skilled in the art without departing from the scope of the invention. Accordingly, it is intended that the invention be limited only by the scope and spirit of the appended claims.

What is claimed is:

1. An inverter with surge current limiting, comprising:
   at least first and second controllable switching devices serially connected between relatively positive and negative voltage buses;
   an inductor serially connected between said switching devices, said inductor having a connection point for coupling to a load; and
   magnetic field generating means proximately positioned with respect to said inductor for generating a constant magnetic field intersecting said inductor and having a polarity oppositely oriented to a magnetic field generated by current through said inductor, surge current through said inductor being opposed by said magnetic field generating means, said magnetic field generating means comprising a permanent magnet.

2. The inverter of claim 1 wherein said permanent magnet comprises a magnetic core for said inductor.

3. The inverter of claim 2 wherein said core comprises a toroid.

4. The inverter of claim 1 including means responsive to a reverse magnetic polarity of said magnet for inhibiting operation of said inverter.

5. The inverter of claim 1 including means responsive to a reversal of polarity of said magnet for reversing connections between said inductor and said switching devices.

6. In a voltage conversion system for providing an alternating current output, the system including at least two controllable switching devices and circuit means coupling said switching devices serially between relatively positive and negative voltage buses, the devices being alternately conducting for producing the alternating current output at an intermediate connection, said circuit means including apparatus for limiting fault currents, said apparatus comprising at least one inductor having a permanent magnet core, said inductor being serially connected in a fault current path and being poled such that current through said inductor creates a magnetic field opposite in polarity to the field of said core.

7. The system of claim 6 wherein said inductor is serially connected between said switching devices.

8. The system of claim 7 wherein said intermediate connection comprises a center tap on said inductor.

9. The system of claim 6 including a second inductor having a permanent magnet core, said at least one inductor being serially connected in circuit with a first one of said switching devices and said second inductor being connected in series circuit arrangement with a second one of said switching devices, said intermediate connection comprising a junction between said at least one inductor and said second inductor.

10. In a voltage conversion system for regulating current to a load, the system including at least one controllable switching device and circuit means for coupling said switching device in series with the load between relatively positive and negative voltage buses, the switching device being gated between conductive and nonconductive states for regulating load current, said circuit means including apparatus for limiting fault currents, said apparatus comprising at least one inductor having a permanent magnet core, said inductor being connected in a fault current path and being poled such that current through said inductor creates a magnetic field opposite in polarity to the magnetic field of said core.

11. The system of claim 10 wherein said switching device comprises a gate turn-off thyristor.

12. The system of claim 10 wherein said permanent magnet core comprises a plurality of ferrite rings stacked to form a toroidal core, said inductor being wound on said toroidal core.

13. The system of claim 10 wherein said permanent magnet core comprises a plurality of ferrite disks, said disks being stacked to form a solid core magnet, said inductor being wound on said stacked disks.

14. The system of claim 13 wherein said disks are circular with radius b, said stacked disks forming a core of length 2b.

15. The system of claim 10 wherein said permanent magnet core comprises a polygonal core, said inductor comprising a plurality of electrically independent coils arranged in pairs, each pair being electrically associated with a corresponding phase of said voltage conversion system.

* * * * *